(12) United States Patent
Ladhani et al.

(10) Patent No.: US 10,199,991 B2
(45) Date of Patent: *Feb. 5, 2019

(54) RF POWER TRANSISTOR CIRCUITS

(71) Applicant: NXP USA, Inc., Austin, TX (US)

(72) Inventors: Hussain H. Ladhani, Tempe, AZ (US);
Gerard J. Bouisse, Toulouse (FR);
Jeffrey K. Jones, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/674,261

(22) Filed: Aug. 10, 2017

(65) Prior Publication Data
US 2017/0338778 A1 Nov. 23, 2017

Related U.S. Application Data

(63) Continuation of application No. 14/942,419, filed on Nov. 16, 2015, now Pat. No. 9,762,185, which is a
(Continued)

(51) Int. Cl.
*H03F 3/04* (2006.01)
*H03F 1/32* (2006.01)
*H03F 1/02* (2006.01)
*H03F 1/56* (2006.01)
*H03F 3/193* (2006.01)
*H03F 3/26* (2006.01)
(Continued)

(52) U.S. Cl.
CPC .......... *H03F 1/3205* (2013.01); *H03F 1/0211* (2013.01); *H03F 1/0288* (2013.01); *H03F 1/3247* (2013.01); *H03F 1/42* (2013.01); *H03F 1/565* (2013.01); *H03F 3/193* (2013.01); *H03F 3/21* (2013.01); *H03F 3/211* (2013.01); *H03F 3/265* (2013.01); *H03F 3/04* (2013.01); *H03F 2200/225* (2013.01); *H03F 2200/391* (2013.01); *H03F 2200/451* (2013.01); *H03F 2203/21106* (2013.01)

(58) Field of Classification Search
CPC ......... H03F 1/3205; H03F 1/0211; H03F 1/42
USPC .................................................. 330/297, 301
See application file for complete search history.

(56) References Cited

U.S. PATENT DOCUMENTS

| | | | |
|---|---|---|---|
| 5,276,406 A | 1/1994 | Samay et al. | |
| 8,659,359 B2* | 2/2014 | Ladhani | H03F 1/0288 |
| | | | 330/302 |
| 9,190,965 B2* | 11/2015 | Ladhani | H03F 1/0288 |

OTHER PUBLICATIONS

Non-Final Office Action dated Jan. 11, 2018 for U.S. Appl. No. 15/674,318, 9 pgs.
(Continued)

*Primary Examiner* — Khanh V Nguyen
*Assistant Examiner* — Khiem Nguyen
(74) *Attorney, Agent, or Firm* — Sherry W. Schumm

(57) ABSTRACT

A radio frequency (RF) power transistor circuit includes a power transistor and a decoupling circuit. The power transistor has a control electrode coupled to an input terminal for receiving an RF input signal, a first current electrode for providing an RF output signal at an output terminal, and a second current electrode coupled to a voltage reference. The decoupling circuit includes a first inductive element, a first resistor, and a first capacitor coupled together in series between the first current electrode of the power transistor and the voltage reference. The decoupling circuit is for dampening a resonance at a frequency lower than an RF frequency.

17 Claims, 14 Drawing Sheets

Related U.S. Application Data continuation of application No. 14/185,382, filed on Feb. 20, 2014, now Pat. No. 9,190,965, which is a continuation of application No. 12/746,793, filed as application No. PCT/IB2010/001283 on Apr. 22, 2010, now Pat. No. 8,659,359.

(51) Int. Cl.
*H03F 3/21* (2006.01)
*H03F 1/42* (2006.01)

(56) References Cited

OTHER PUBLICATIONS

Non-Final Office Action dated Feb. 26, 2018 for U.S. Appl. No. 14/919,990, 15 pgs.
Notice of Allowance dated Aug. 16, 2018 for U.S. Appl. No. 15/674,318, 7 pages.
Final Office Action dated Sep. 20, 2018 for U.S. Appl. No. 14/919,990, 13 pages.

* cited by examiner

RF POWER TRANSISTOR CIRCUITS

RELATED APPLICATIONS

This application is a continuation of co-pending, U.S. patent application Ser. No. 14/942,419, filed on Nov. 16, 2015, which is a continuation of U.S. Pat. No. 9,190,965, issued on Nov. 17, 2015, which is a continuation of U.S. Pat. No. 8,659,359, issued on Feb. 25, 2014, which was a National Stage Entry under 37 C.F.R. 371 of PCT/IB2010/001283, filed on Apr. 22, 2010.

BACKGROUND

Field

This disclosure relates generally to semiconductors, and more specifically, to the radio frequency power devices.

Related Art

In the field of wireless communication, integrated circuits commonly implement radio frequency power amplifiers (RFPAs) which supply an amplified amount of output power. The operating frequencies for wireless communication have increased as the demand for wireless communication has increased. RF power amplifiers must have sufficient gain and bandwidth for operation well into the gigahertz range. Conventional RF power amplifiers have an upper limit to the bandwidth of the input signal that can be amplified before incurring excessive distortion and ruggedness issues. As signal bandwidth is increased, conventional RF power amplifiers exhibit increased distortion in the sidebands. Additionally, high voltage excursions are present on the drain electrode of the power transistor used for amplification. The bandwidth limitation imposed on RF power amplifiers is caused by several sources. One source of the bandwidth limitation is due to impedance resonances loading the gate and drain of the power transistor. The interaction between components which are internal to the pre-matched RF power transistor and external circuit board components creates resonances at frequencies that are of the order of the modulation bandwidth of the RF signal.

Another aspect of RF power amplifier operation is the use of Digital Pre-Distortion (DPD). Digital Pre-Distortion is a system which is used in conjunction with RF power amplifiers to reduce the level of distortion and thereby comply with linearity specifications. Conventional DPD systems perform well for RF power amplifiers up to signal bandwidths where the baseband impedance is low and the phase is close to linear. However, any kind of resonance or rapid phase transition presents a hard limit for Digital Pre-Distortion correction.

Another behavior of RF power amplifiers is the presence of a low frequency gain peak which is attributable to the pre-matched RF power transistor. This gain peak is out-of-band but it is important that the peak be as low as possible. The low frequency gain peak can cause stability issues, as well as linearization problems when using a DPD system. Conventional RF power amplifiers generally do not have all of the characteristics of very high signal bandwidth, low RF power transistor drain voltage swing, good digital pre-distortion correction and low out of band gain peaks.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

There is disclosed herein a power transistor circuit for use in a power amplifier that uses a frequency decoupling network capable of communicating high instantaneous bandwidth signals. A decoupling circuit having an inductive element, a resistive element and a capacitor is coupled together in series between a control electrode of a power transistor and a power supply terminal. The decoupling circuit dampens a resonance at a frequency lower than an RF frequency. The disclosed structure provides an RF power amplifier having low baseband impedance across an entire signal bandwidth and permits significantly increased video bandwidth. Low frequency resonance is corrected by the decoupling circuit and low frequency phase transition is eliminated to ensure good digital pre-distortion performance. The resistive element of the decoupling circuit permits pre-distortion linearization of signals with very closely spaced carriers and thus provides improved digital pre-distortion linearization.

Figure 1:
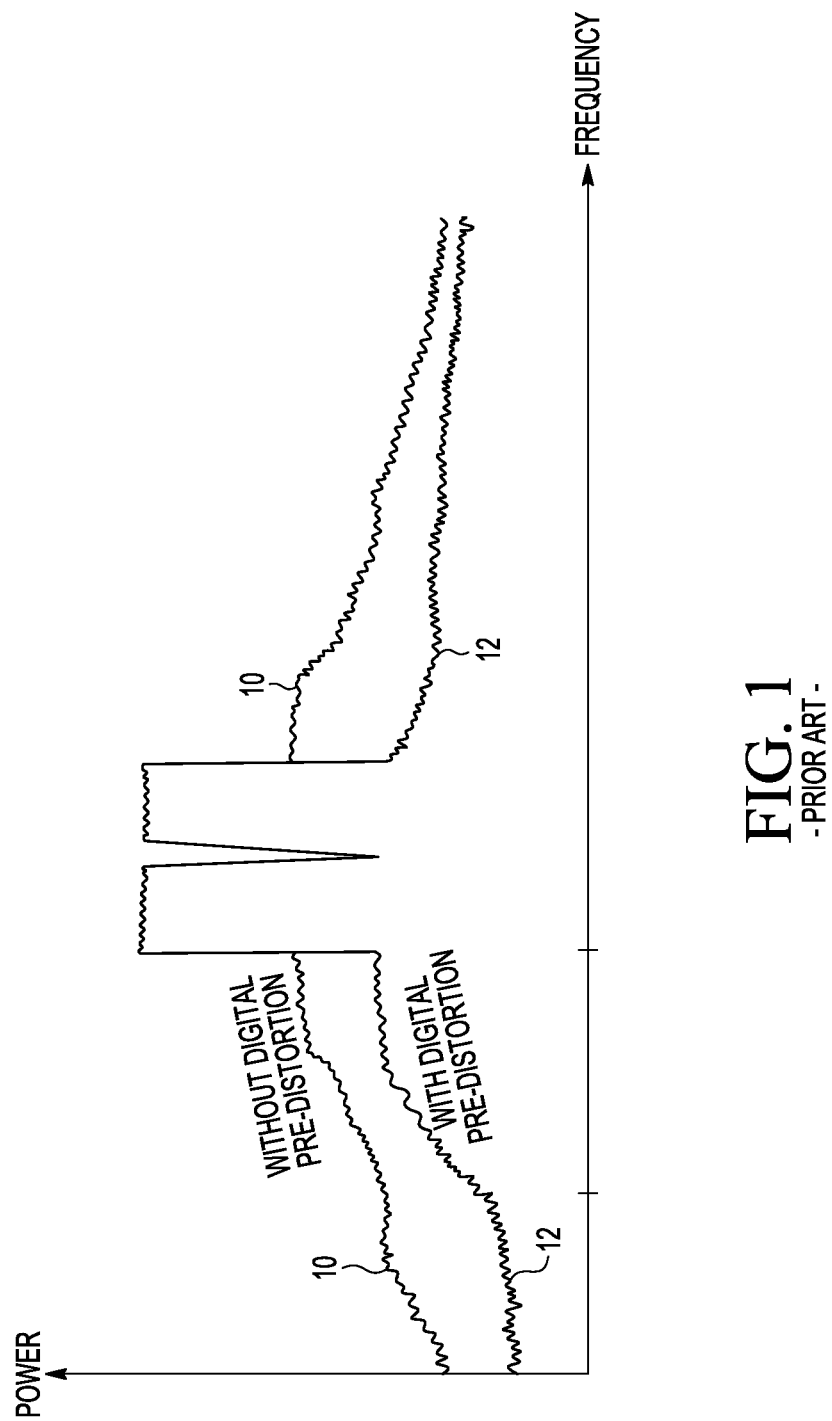
FIG. 1 illustrates in graphical form a plot of power and frequency of a power amplifier response of a power amplifier that uses a prior art implementation of a decoupling network.

Illustrated in FIG. 1 is a plot of power and frequency of a power amplifier response of a power amplifier implementing a decoupling network which is intended to improve instantaneous bandwidth. Two superimposed frequency responses are illustrated in FIG. 1 having two closely spaced carriers or channels. A frequency response 10 is illustrated having an in-band range in the middle of the illustrated frequency response. Without the use of digital pre-distortion, the frequency response 10 exhibits a significant non-linear power response at both low-band and high-band. This out-of-band power represents distortion in the sideband frequencies. Frequency response 12 illustrates when digital pre-distortion is used in the power amplifier. With digital pre-distortion the amount of power reduced in the sideband frequencies is limited, due to low frequency resonances present in the conventional decoupling network. As the spacing of the two carrier signals are moved farther apart, the low frequency resonances in the decoupling network become inconsequential since the envelope frequencies that cause the distortion products are now higher than the low frequency resonance. This prior art decoupling network improves the upper frequency limit of instantaneous bandwidth capability, but closely-spaced signals have very poor distortion correction.

Figure 2:
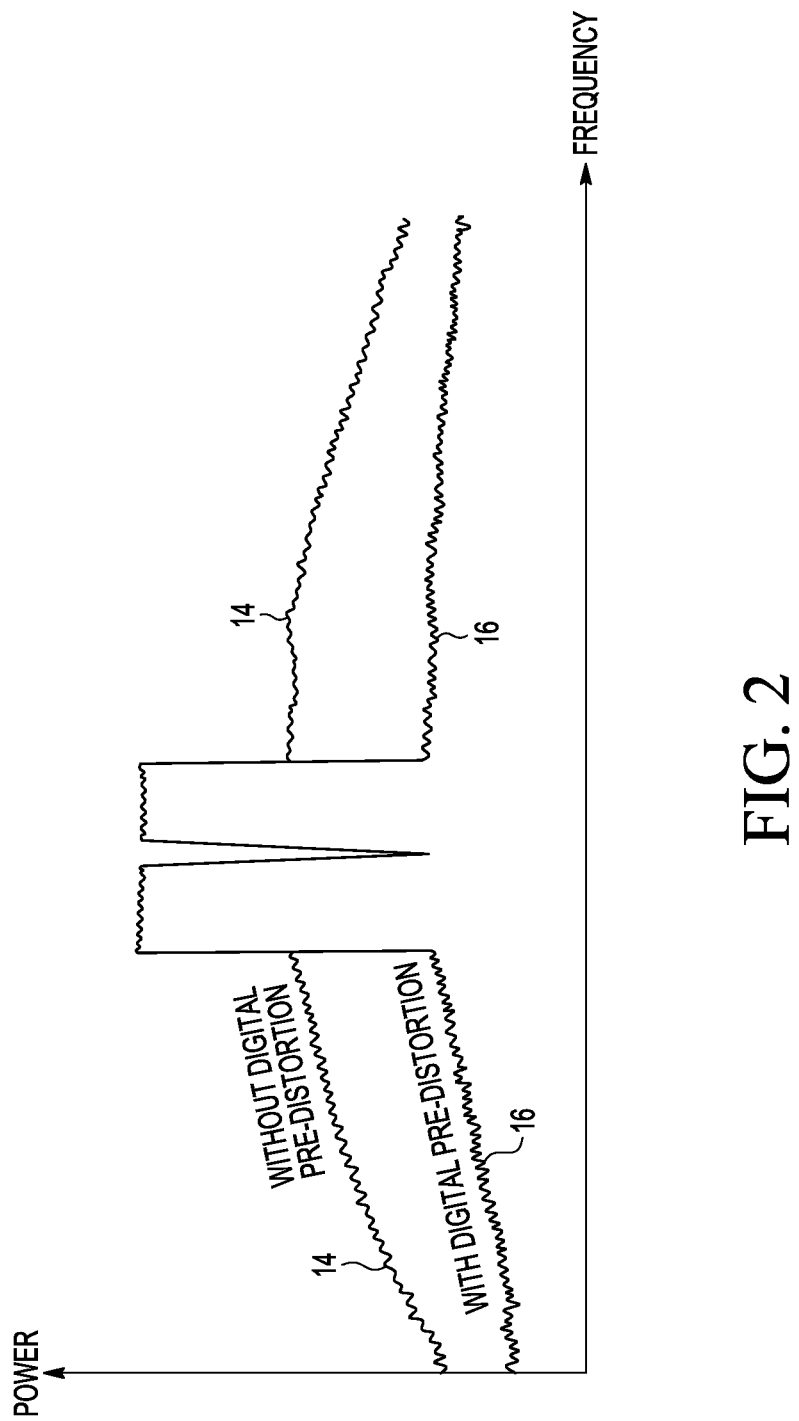
FIG. 2 illustrates in graphical form a plot of power and frequency of a power amplifier response of a power amplifier that implements a decoupling network embodying principles of the present invention.

Illustrated in FIG. 2 is a plot of power and frequency of a power amplifier response of a power amplifier that implements a decoupling network in accordance with principles of the present invention. The illustrated decoupling network that is connected to the gate and/or drain of a power transistor provides low baseband impedance across an entire signal bandwidth. The frequency response 14 shows that without digital pre-distortion, there is significant power (i.e. distortion) in the low-band and high-band frequency ranges. The frequency response 16, which is superimposed with frequency response 14, shows a large reduction in the power of the side bands, even at frequencies just above or below the carrier. The illustrated decoupling network improves both the high instantaneous bandwidth capability, as well as distortion correction of closely-spaced signals. Discussed herein will be circuits and methods for keeping the higher instantaneous bandwidth capability, while also allowing distortion correction of closely-spaced signals. By way of example only, in one form the represented instantaneous bandwidth frequencies are a range of frequencies from D.C. to around the 500 MHz range. The in-band or passband range of frequencies is from around 1.6 GHz to 3.7 GHz.

Figure 3:
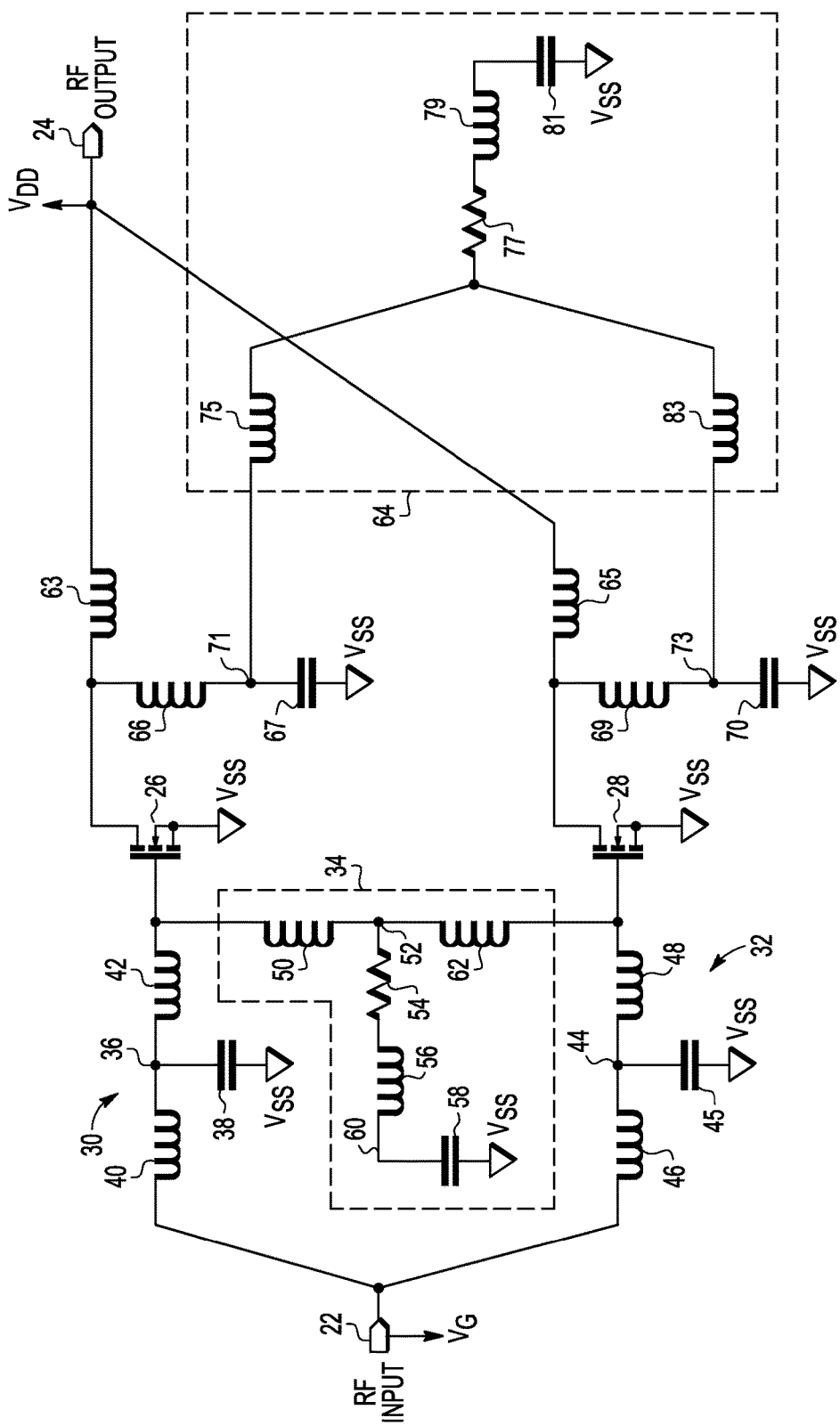
FIG. 3 illustrates in schematic diagram form a power transistor circuit embodying principles of the present invention.

Illustrated in FIG. 3 is a circuit 20 that is an output portion of an RF (radio frequency) power amplifier. An RF input signal is coupled to an RF input terminal 22 and an amplified RF output signal is provided at an RF output terminal 24. The circuit 20 generally has a power FET 26 (i.e., RF power Field Effect Transistor) and a power FET 28 with each having a gate, a drain and a source. In the illustrated form, the power FETs 26 and 28 each are N-channel devices. A gate-side RF matching network 30 is connected between the RF input terminal 22 and the gate of the power FET 26. A gate-side RF matching network 32 is connected between the RF input terminal 22 and the gate of the power FET 28. A gate-side decoupling circuit 34 is connected between a ground $V_{SS}$ terminal and each of the gates of power FET 26 and power FET 28. The drain of each of power FET 26 and power FET 28 is connected to the RF output terminal 24. A power supply voltage labeled $V_{DD}$ is connected to the drains of power FET 26 and power FET 28 at the RF output terminal 24. A drain-side decoupling circuit 64 is connected between the drain of each of power FET 26 and power FET 28. Each of power FET 26 and power FET 28 has a source connected to the ground $V_{SS}$ terminal. A conductor having an inductive element in the form of an inductance 40 that is inherent in the conductive material of the conductor is connected between the RF input terminal 22 and a node 36. It should be understood that the conductor may be implemented in various forms. For example, a conductive or metal wire may be used as the conductor. A conductive layer or conductive strip commonly used in semiconductor manufacturing may be implemented from any of various conductive materials, such as metals including copper, tungsten and various metal alloys. A first electrode of an RF matching capacitor 38 is connected to node 36. A second electrode of the capacitor 38 is connected to the ground $V_{SS}$ terminal. The node 36 is connected to the gate of the power FET 26 by a conductor having an inductance 42 that is inherent in the conductive material of the conductor.

Within the gate-side decoupling circuit 34, a node 52 is connected to the gate of the power FET 26 by a conductor having an inductance 50 that is inherent in the conductive material of the conductor. Node 52 is also connected to the gate of the power FET 28 by a conductor having an inductance 62 that is inherent in the conductive material of the conductor. A first terminal of a resistor 54 is connected to the node 52 and a second terminal of the resistor 54 is connected to a first electrode of a low frequency decoupling capacitor 58 via a conductor having an inductance 56 that is inherent in the conductive material of the conductor. The first electrode of the decoupling capacitor 58 represents a decoupled node 60. A second electrode of the decoupling capacitor 58 is connected to the ground $V_{SS}$.

Within the gate-side RF matching network 32, the RF input terminal 22 is connected to a node 44 via a conductor having an inductance 46 that is inherent in the conductive material of the conductor. A first electrode of an RF matching capacitor 45 is connected to node 44, and a second electrode of the RF matching capacitor 45 is connected to the ground $V_{SS}$. The node 44 is connected via a conductor having an inductance 48 that is inherent in the conductive material of the conductor to the gate of the power FET 28 and to the conductor having inductance 62.

Within the drain side of power FET 26, a conductor having an inductance 66 that is inherent in the conductive material of the conductor has a first end connected to the drain of power FET 26 and a second end connected to a node 71. A conductor having an inductance 63 that is inherent in the conductive material of the conductor has a first end connected to the drain of power FET 26 and a second end connected to the RF output terminal 24. A first electrode of a D.C. blocking capacitor 67 is connected to node 71. A second electrode of the D.C. blocking capacitor 67 is connected to the ground $V_{SS}$. Within the drain-side decoupling circuit 64, a conductor having an inductance 75 that is inherent in the conductive material of the conductor has a first end connected to the node 71 and a second end connected to a first terminal of a resistor 77. A second terminal of the resistor 77 is connected to a first end of a conductor having an inductance 79 that is inherent in the conductive material of the conductor. A second end of the conductor having the inductance 79 is connected to a first electrode of a decoupling capacitor 81. A second electrode of the decoupling capacitor 81 is connected to the ground $V_{SS}$. A conductor having an inductance 69 that is inherent in the conductive material of the conductor has a first end connected to the drain of power FET 28 and a second end connected to a node 73. A first electrode of an RF matching capacitor 70 is connected to node 73. A second electrode of the RF matching capacitor 70 is connected to the ground $V_{SS}$. Within the drain-side decoupling circuit 64, a conductor having an inductance 83 that is inherent in the conductive material of the conductor has a first end connected to the node 73 and a second end connected to the first terminal of the resistor 77.

In operation, circuit 20 implements two power FETs that have their respective gates coupled to the RF input terminal 22 and their respective drains coupled to the RF output terminal 24. It should be understood that in another form only one power FET, such as power FET 26 may be implemented. In that form, inductances 46, 48, 62, 65, 69 and 83, capacitors 45 and 70 and power FET 28 are not present. In the illustrated form of FIG. 3 circuit 20 receives an RF input signal and selectively amplifies or increases the power of the RF signal to provide an amplified RF output signal at output terminal 24. The RF output signal is superimposed onto the terminal for the supply voltage $V_{DD}$.

The RF matching networks 30 and 32 function to raise the impedance at the RF input terminal 22. Because the impedance of the gate of each of power FET 26 and power FET 28 is low, the RF matching networks 30 and 32 are needed to more closely match the impedance of the circuitry (not shown) that is coupled to the RF input terminal 22 for providing an RF input signal. A closely matched impedance avoids a power loss or gain loss of the RF signal on the gate side of each of power FET 26 and power FET 28. The values of the inductances 40 and 42 and capacitor 38 as well as the value of the inductances 46 and 48 and capacitor 45 are chosen to raise the input impedance to a predetermined input impedance. The known input impedance allows an outside user to present a matching impedance to the circuit 20. On the drain side of power FET 26, capacitor 67 also functions as part of an RF matching circuit to provide, along with inductances 66 and 63, an impedance to the RF output terminal 24 to avoid a power loss or gain loss. Similarly, on the drain side of power FET 28, capacitor 70 also functions as part of an RF matching circuit to provide, along with inductances 65 and 69, an impedance to the RF output terminal 24 to avoid a power loss or gain loss. A user can therefore closely match the impedance of circuitry that is coupled to the RF output terminal 24 to prevent a performance loss. The gate side decoupling network 34 presents a high impedance to the passband range of frequencies and above. The gate side decoupling network 34 is functional in the low band range of frequencies. In particular, the gate side decoupling network 34 provides a low impedance termination to ground for the distortion products that develop due to envelope frequencies. The gate side decoupling network 34, in the absence of resistor 54, exhibits a low frequency resonance which is undesired. In particular, the inductor/capacitor circuit by itself creates an unwanted resonance in the 1 to 20 MHz range which interferes with pre-distortion linearization and creates a high impedance at very low baseband frequencies. However, resistor 54 is inserted between the gate of the power FETs 26 and 28 and capacitor 58 to dampen or attenuate the low frequency resonance created by the gate side decoupling network 34. The low frequency resonance which is dampened by the resistor is at a frequency that is lower than an RF frequency. By dampening the low frequency resonance, digital pre-distortion effectively reduces distortion in the side bands, even with very closely-spaced carriers.

Similarly, the decoupling circuit 64 presents a high impedance to the passband range of frequencies and above on the drain side of each of power FETs 26 and 28. The decoupling circuit 64 is functional in the low band range of frequencies. In particular, the decoupling circuit 64 provides a low impedance termination to ground for the distortion products that develop due to envelope frequencies. The decoupling circuit 64, in the absence of resistor 77, exhibits a low frequency resonance which is undesired. However, resistor 77 is inserted between the drain of the power FETs 26 and 28 and capacitor 81 to dampen or attenuate the low frequency resonance created by the decoupling circuit 64. It should be noted that at node 71, the signal path through inductance 75, resistor 77, inductance 79 and capacitor 81 is a high impedance path which blocks the RF signal from being attenuated by resistor 77. The same is true at node 73 with respect to inductances 83 and 79, resistor 77 and capacitor 81. Thus, at the drain of power FET 26 the RF signal is coupled to the RF output terminal 24 except for a small portion of RF which is lost via matching capacitors 67 and 70 which are low impedance. Thus the drain side of each of power FET 26 and power FET 28 has low RF loss. Within the decoupling circuits 34 and 64 the inductive elements as represented by the inductances provide for direct control of where low frequency resonance occurs. Therefore it is important to have the values of the inductive components be as small as possible. The capacitors within the decoupling circuits 34 and 64 provide for good low-frequency short circuiting for decoupling. Hence it is important to get the capacitive value of capacitors 58 and 81 as high as possible. However, with current multiple layer capacitor technology, it is difficult to get a very high valued capacitor with a desired form factor and breakdown voltage. Hence practical limitations force these capacitors to have a value that is limited to the hundreds of nanoFarads range. As a result, the LC components of the decoupling circuits 34 and 64 create the unwanted resonance in the 1-20 MHz range which interferes with pre-distortion linearization. Thus the use of resistors 54 and 77 to dampen this resonance provides a noticeable reduction in baseband impedance across the signal bandwidth and allows the use of closely-spaced signals with digital pre-distortion.

In another form of circuit 20, two RF outputs rather than a single RF output at terminal 24 may be implemented. In this alternate form, the second terminal of inductance 65 is not connected to terminal 24 but rather is left unconnected as a second RF output. The power supply voltage $V_{DD}$ is also connected to this second RF output. The modified circuit 20 provides a dual path device and is a balanced configuration. The two outputs can be used either in a push-pull configuration or in a Doherty amplifier configuration. The power combining of the two RF signal paths is implemented external to circuit 20.

Figure 4:
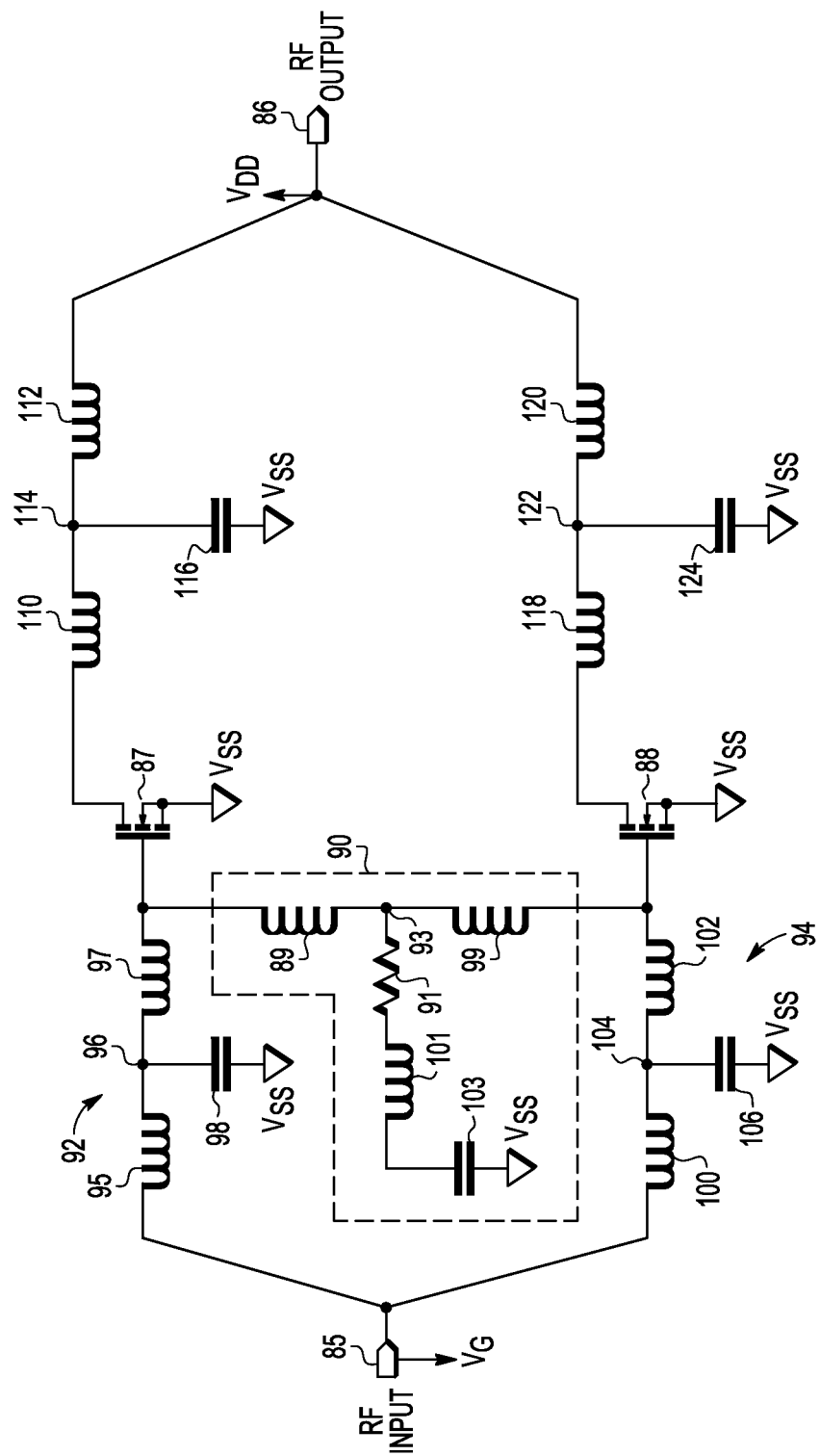
FIG. 4 illustrates in schematic diagram form another power transistor circuit embodying principles of the present invention.

Illustrated in FIG. 4 is a circuit 84 that is a portion of another power amplifier in accordance with another form. An RF input signal is coupled to an RF input terminal 85 and an amplified RF output signal is provided at an RF output terminal 86. The circuit 84 generally has a power FET 87 (Field Effect Transistor) and a power FET 88 with each having a gate, a drain and a source. In the illustrated form, the power FETs 87 and 88 each are N-channel devices. A gate-side RF impedance matching network 92 is connected between the RF input terminal 85 and the gate of the power FET 87. A gate-side RF impedance matching network 94 is connected between the RF input terminal 85 and the gate of the power FET 88. A gate-side decoupling circuit 90 is connected between a ground $V_{SS}$ terminal and each of the gates of power FET 87 and power FET 88. The drain of each of power FET 87 and power FET 88 is connected to the RF output terminal 86. A power supply voltage labeled $V_{DD}$ is connected to the drains of power FET 87 and power FET 88 at the RF output terminal 86. Each of power FET 87 and power FET 88 has a source connected to the ground $V_{SS}$ terminal. A conductor having an inductive element in the form of an inductance 95 that is inherent in the conductive material of the conductor is connected between the RF input terminal 85 and a node 96. It should be understood that the conductor may be implemented in various forms. For example, a conductive or metal wire may be used as the conductor. A conductive layer or conductive strip commonly used in semiconductor manufacturing may be implemented from any of various conductive materials, such as metals including copper, tungsten and various metal alloys. A first electrode of an RF matching capacitor 98 is connected to node 96. A second electrode of the capacitor 98 is connected to the ground $V_{SS}$ terminal. The node 96 is connected to the gate of the power FET 87 by a conductor having an inductance 97 that is inherent in the conductive material of the conductor.

Within the gate-side decoupling circuit 90, a node 93 is connected to the gate of the power FET 87 by a conductor having an inductance 89 that is inherent in the conductive material of the conductor. Node 93 is also connected to the gate of the power FET 88 by a conductor having an inductance 99 that is inherent in the conductive material of the conductor. A first terminal of a resistor 91 is connected to the node 93, and a second terminal of the resistor 91 is connected to a first electrode of a low frequency decoupling capacitor 103 via a conductor having an inductance 101 that is inherent in the conductive material of the conductor. A second electrode of the decoupling capacitor 103 is connected to the ground $V_{SS}$.

Within the gate-side RF matching network 94, the RF input terminal 85 is connected to a node 104 via a conductor having an inductance 100 that is inherent in the conductive material of the conductor. A first electrode of an RF matching capacitor 106 is connected to node 104, and a second electrode of the RF matching capacitor 106 is connected to the ground $V_{SS}$. The node 104 is connected via a conductor having an inductance 102 that is inherent in the conductive material of the conductor to the gate of the power FET 88 and to the conductor having inductance 99.

On the drain side of power FET 87, an RF matching network is provided by inductances 110 and 112 and an RF matching capacitor 116. A conductor having an inductance 110 that is inherent in the conductive material of the conductor has a first end connected to the drain of power FET 87 and a second end connected to a node 114. A conductor having an inductance 112 that is inherent in the conductive material of the conductor has a first end connected to the node 114 and a second end connected to the RF output terminal 86. A first electrode of the RF matching capacitor 116 is connected to node 114. A second electrode of the RF matching capacitor 116 is connected to the ground $V_{SS}$.

On the drain side of power FET 88, an RF matching network is provided by inductances 118 and 120 and an RF matching capacitor 124. A conductor having an inductance 118 that is inherent in the conductive material of the conductor has a first end connected to the drain of power FET 88 and a second end connected to a node 122. A conductor having an inductance 120 that is inherent in the conductive material of the conductor has a first end connected to the node 122 and a second end connected to the RF output terminal 86. A first electrode of the RF matching capacitor 124 is connected to node 122. A second electrode of the RF matching capacitor 124 is connected to the ground $V_{SS}$.

In operation, circuit 84 uses a decoupling circuit only on the gate side of the power FETs. An RF signal is received at the RF input terminal 85 and is amplified and provided at an RF output terminal 86 which is superimposed onto the terminal for the supply voltage $V_{DD}$. A decoupling circuit, in the form of decoupling circuit 90, is provided in circuit 84 only on the gate side of power FETs 87 and 88. Capacitors 98 and 106 respectively function as RF matching capacitors for impedance matching purposes as previously described. The decoupling circuit 90 functions analogous to the gate side decoupling circuit 34 of circuit 20 and thus a detailed functional description will not be repeated. Impedance matching networks 92 and 94 function to provide an impedance on the gate side of power FETs 87 and 88, respectively. On the drain side of power FETs 87 and 88, the capacitive value of respective capacitors 116 and 124 is low and shifts the low frequency resonance up in frequency. Thus there is no need for the decoupling circuit that is on the gate side to be used on the drain side.

Figure 5:
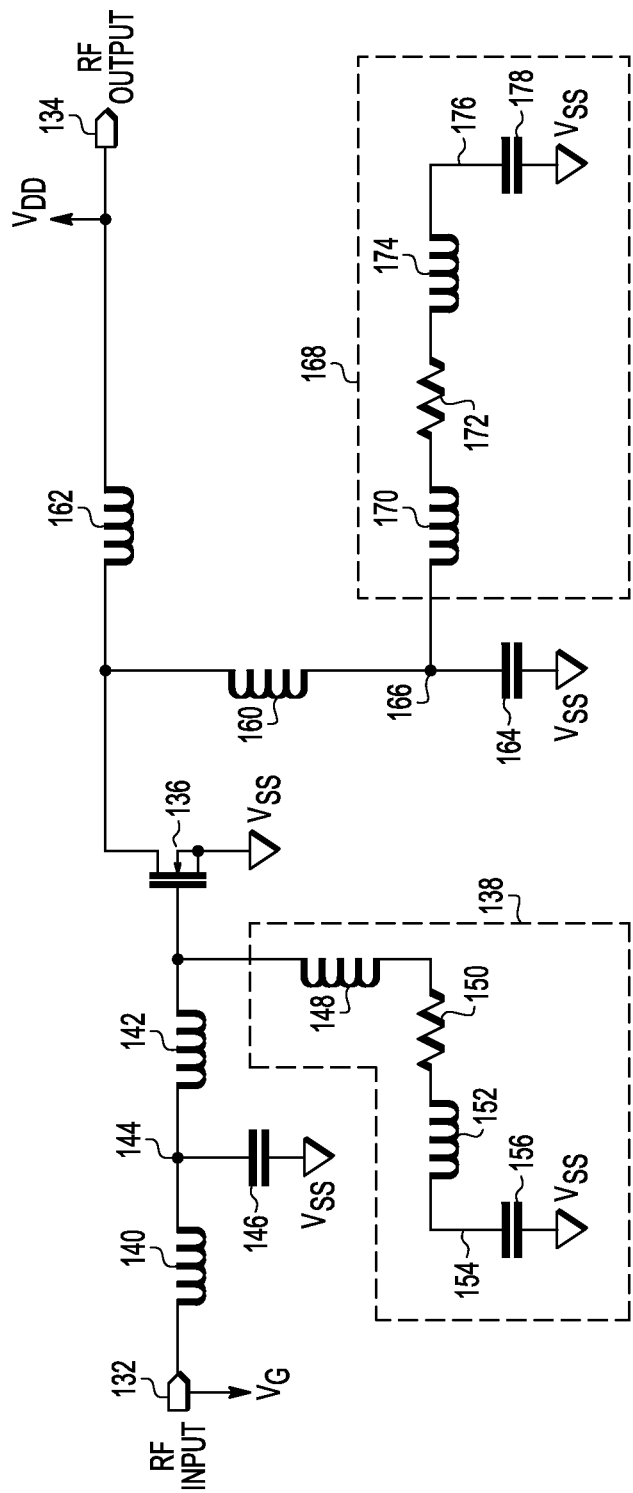
FIG. 5 illustrates in schematic diagram form yet another power transistor circuit embodying principles of the present invention.

Illustrated in FIG. 5 is a circuit 130 that is a portion of another power amplifier in accordance with another form. An RF input terminal 132 is connected to a first terminal of an inductance 140 that is inherent in a conductor connected to the RF input terminal 132. A second terminal of inductance 140 is connected to a first electrode or first terminal of an RF impedance matching capacitor 146 at a node 144. A second terminal of capacitor 146 is connected to a $V_{SS}$ power supply terminal. The second terminal of inductance 140 is also connected to a first terminal of an inductance 142 which is also an inherent inductance. A second terminal of inductance 142 is connected to a control electrode or gate of an RF power transistor 136. The gate of transistor 136 is connected to a gate side decoupling circuit 138. The decoupling circuit 138 has a first terminal of an inductance 148 connected to the gate of transistor 136. A second terminal of inductance 148 is connected to a first terminal of a resistor 150. A second terminal of resistor 150 is connected to a first terminal of an inductance 152. A second terminal of inductance 152 is connected to a first terminal of a capacitor 156 at a node 154. A second terminal of capacitor 156 is connected to the $V_{SS}$ power supply terminal. The RF power transistor 136 is an N-channel transistor in the illustrated form. A source of transistor 136 is connected to the $V_{SS}$ power supply terminal. A drain of transistor 136 is connected to a first terminal of both an inductance 160 and inductance 162. Inductance 160 and inductance 162 each represent an inherent inductance associated with the illustrated conductor. A second terminal of inductance 162 is connected to an RF output terminal 134 and to a positive power supply terminal labeled $V_{DD}$. A second terminal of inductance 160 is connected to a drain side decoupling circuit 168 and to a first terminal of a capacitor 164 at a node 166. A second terminal of capacitor 164 is connected to the $V_{SS}$ power supply terminal. The drain side decoupling circuit 168 has a first terminal of an inductance 170 connected to the node 166. A second terminal of inductance 170 is connected to a first terminal of a resistor 172. A second terminal of resistor 172 is connected to a first terminal of an inductance 174. A second terminal of the inductance 174 is connected to a first terminal of a capacitor 178 at a node 176. A second terminal of capacitor 178 is connected to the $V_{SS}$ power supply terminal. Inductance 170 and inductance 174 of the drain side decoupling circuit 168 each represent an inherent inductance associated with the illustrated conductor.

In operation, circuit 130 implements a single power FET amplification circuit. On the gate side, both an RF impedance matching network and a decoupling circuit are used.

Similarly, on the drain side, both an RF impedance matching network using capacitor 164 and the decoupling circuit 168 are provided. Their operational function on the drain side of power FET 136 is the same as was described for the drain side matching network and decoupling circuit of FIG. 3 and thus will not be repeated. When the output RF signal is at node 166, the impedance presented by the decoupling circuit 168 is high and thus virtually all of the RF signal is sent through capacitor 164. The impedance of capacitor 164 at RF frequencies is low enough that the RF signal is not significantly attenuated by capacitor 164. Thus the gain of the RF signal at terminal 134 is not significantly degraded by either the RF impedance matching network or the decoupling circuit 168. Similarly, on the gate side of power FET 136 the functionality of capacitor 146 and the decoupling circuit 138 is similar to that described in connection with the RF impedance matching network and decoupling circuit for FIGS. 3 and 4 and will not be repeated. It should be noted that in another form circuit 130 may be modified to operate without the use of the decoupling circuit 168 on the drain side. In this form there is gate side baseband termination provided by the decoupling circuit 138 and only an RF impedance matching function on the drain side. In another form, the decoupling circuit 168 may be used on the drain side with only an RF impedance matching function used on the gate side.

Figure 6:
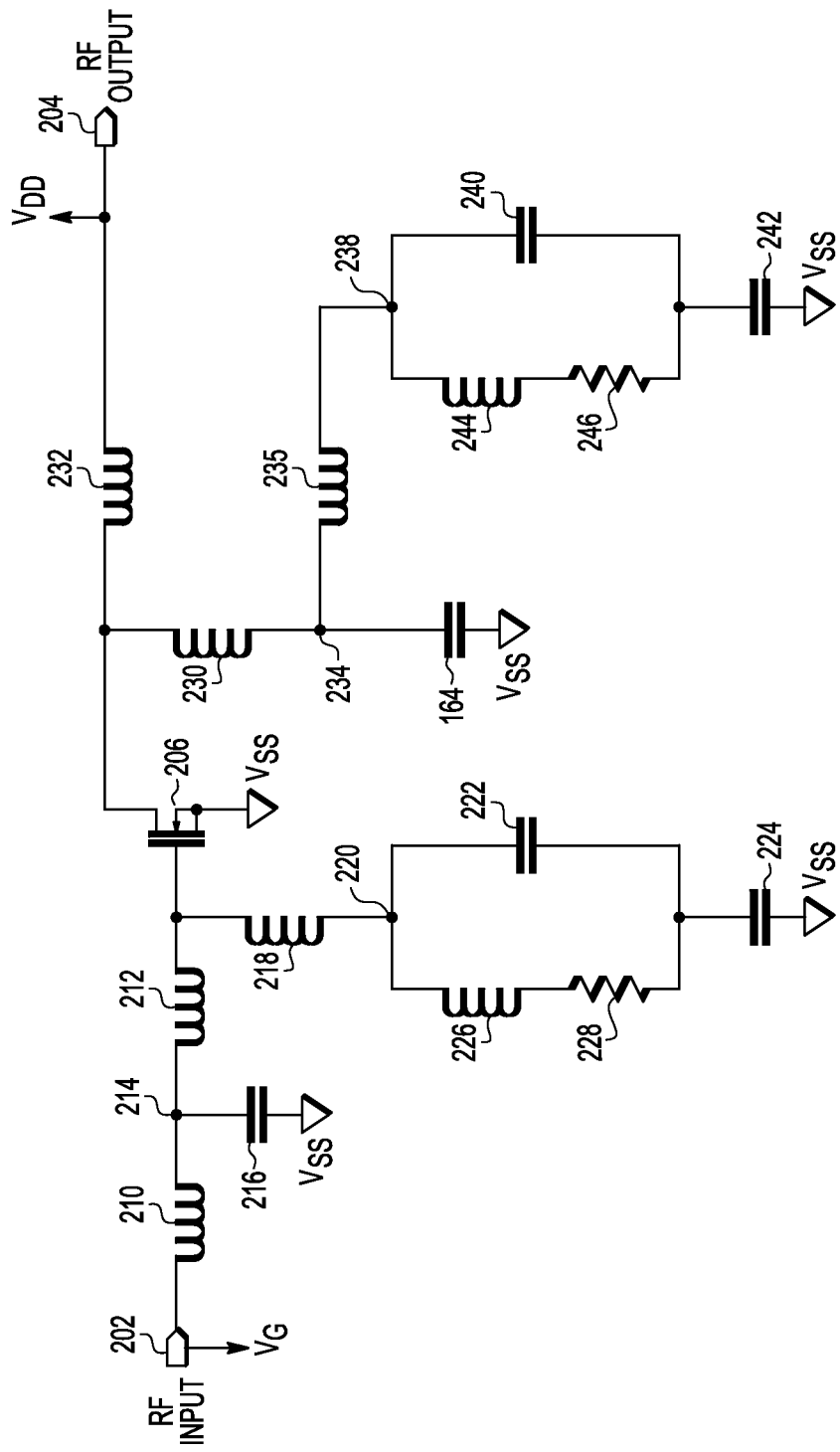
FIG. 6 illustrates in schematic diagram form yet another power transistor circuit embodying principles of the present invention.

Illustrated in FIG. 6 is a circuit 200 that is a portion of another power amplifier in accordance with another form. An RF input terminal 202 is connected to a first terminal of an inductance 210. A second terminal of the inductance 210 is connected at a node 214 to a first terminal of an RF impedance matching capacitor 216. A second terminal of the RF impedance matching capacitor 216 is connected to a $V_{SS}$ supply voltage terminal. A first terminal of an inductance 212 is connected to the first terminal of the capacitor 216. A second terminal of inductance 212 is connected to a gate of an RF power transistor 206 or power FET and to a first terminal of an inductance 218. A second terminal of the inductance 218 is connected to a first terminal of an inductance 226 at a node 220 and to a first terminal of a capacitor 222 at the node 220. A first terminal of the resistor 228 is connected to a second terminal of the inductance 226. A second terminal of the resistor 228 is connected to a first terminal of a capacitor 224. A second terminal of capacitor 224 is connected to the $V_{SS}$ supply voltage terminal. A second terminal of the capacitor 222 is also connected to the first terminal of the capacitor 224. In the illustrated form the RF power transistor 206 is an N-channel transistor. A source of RF power transistor 206 is connected to the $V_{SS}$ supply voltage terminal. A drain of RF power transistor 206 is connected to a first terminal of inductance 232. A second terminal of inductance 232 is connected to an RF output terminal 204 and to a $V_{DD}$ supply voltage terminal. The drain of RF power transistor 206 is also connected to a first terminal of an inductance 230. A second terminal of inductance 230 is connected to a first terminal of a capacitor 164 at a node 234. A second terminal of capacitor 164 is connected to the $V_{SS}$ supply voltage terminal. A first terminal of an inductance 235 is connected to the first terminal of capacitor 164 at node 234. A second terminal of inductance 235 is connected to a first terminal of an inductance 244 at a node 238 and to a first terminal of a capacitor 240. A second terminal of the inductance 244 is connected to a first terminal of a resistor 246. A second terminal of resistor 246 is connected to a first terminal of a capacitor 242. A second terminal of capacitor 242 is connected to the $V_{SS}$ supply voltage terminal. A second terminal of capacitor 240 is connected to the first terminal of the capacitor 242 and to the second terminal of the resistor 246. Each of inductance 210, inductance 212, inductance 218, inductance 226, inductance 230, inductance 232, inductance 235 and inductance 244 is an inductive element that is inherent in a conductor of circuit 200.

In operation, circuit 200 uses both an RF impedance matching network and a decoupling network on the gate side of a power FET and on the drain side of the power FET. In this form the decoupling networks on the gate side (inductance 226, resistor 228, capacitor 222 and capacitor 224) and drain side (inductance 244, resistor 246, capacitor 240 and capacitor 242) is formed with a capacitor in parallel with an inductance in series with a resistor. This form of RF decoupler also functions to present a high impedance in the passband range of frequencies, both on the gate side of RF power transistor 206 and on the drain side of RF power transistor 206. The decoupling networks are functional in the low band range of frequencies. The decoupling networks provide a low frequency termination to ground for the distortion products that develop due to envelope frequencies. The decoupling networks, in the absence of resistor 228 or resistor 246, exhibit a low frequency resonance which is undesired. In particular, the inductance and capacitance create an unwanted resonance in the 1 to 20 MHz range which interferes with pre-distortion linearization and creates a high impedance at very low baseband frequencies. However, resistors 228 and 246 are respectively inserted between the gate or drain of the RF power transistor 206 and capacitors 224 and 242, respectively, to dampen or attenuate the low frequency resonance created by the respective decoupling networks. The low frequency resonance which is dampened by each resistor is at a frequency that is lower than an RF frequency.

In alternatives to the form illustrated in FIG. 6 it should be appreciated that the nodes 220 and 234 of the respective gate side and drain side decoupling circuits may be connected to the power FET at differing points. In an alternative form on the gate side for example, the decoupling circuit may be physically connected at the physical location of the RF input terminal.

Figure 7:
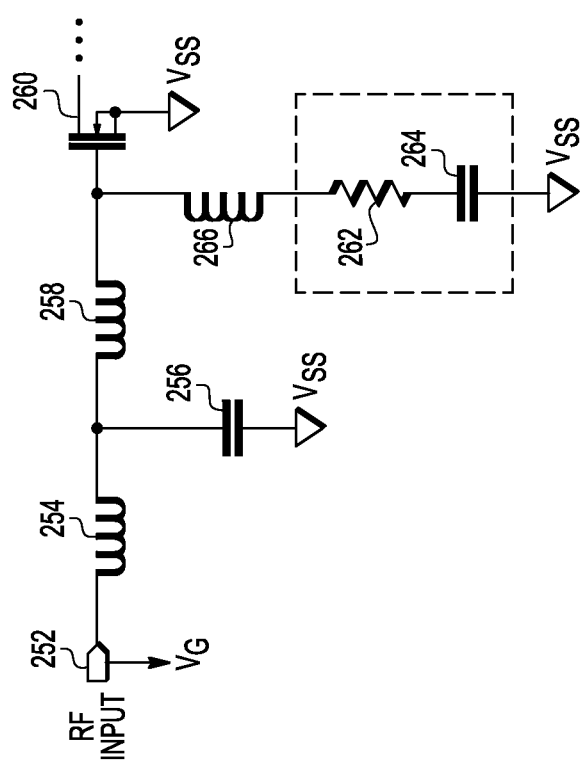
FIG. 7 illustrates in schematic diagram form a portion of another power transistor circuit embodying principles of the present invention.

Illustrated in FIG. 7 is the gate side portion of a circuit 250 that is a portion of another power amplifier in accordance with another form. An RF input terminal 252 is connected to a first terminal of an inductance 254. A second terminal of inductance 254 is connected to a first terminal of an RF impedance matching capacitor 256 and to a first terminal of an inductance 258. A second terminal of capacitor 256 is connected to the $V_{SS}$ supply voltage terminal. A second terminal of inductance 258 is connected to a gate or control electrode of an RF power transistor 260 (i.e. RF power FET). The gate of the RF power transistor 260 is also connected to a first terminal of an inductance 266. A second terminal of the inductance 266 is connected to a first terminal of a resistor 262. A second terminal of resistor 262 is connected to a first terminal of a capacitor 264. A second terminal of the capacitor 264 is connected to the $V_{SS}$ supply voltage terminal.

In operation, the capacitor 256 functions as an RF impedance matching capacitor and the inductance 266, resistor 262 and capacitor 264 function as a decoupling circuit for the gate side of the RF power transistor 260. It should be appreciated that a similar RF impedance matching network and decoupling circuit may be provided on the drain side of the RF power transistor 260. The decoupling circuit uses a resistance for the purpose of dampening a resonance at a frequency lower than an RF frequency. However, instead of the resistance being a separate resistor, resistance is incorporated into the capacitor 264 as a composite structure. In this form a thin film resistor or other lossy component is integrated into the capacitor structure. The presence of a resistive thin film sufficiently dampens the previously discussed resonance which the decoupling circuit creates at low frequency.

Figure 8:
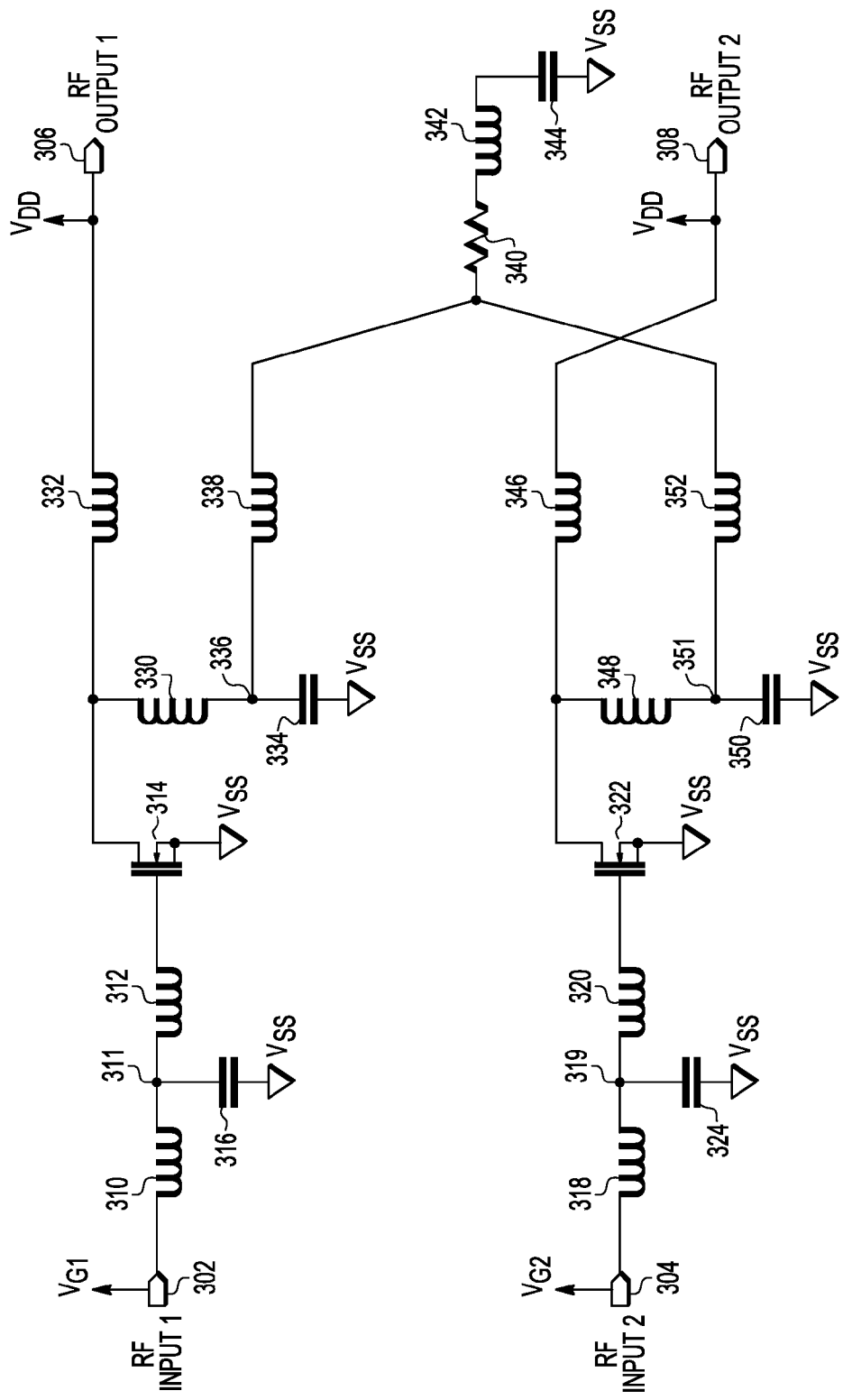
FIG. 8 illustrates in schematic diagram form another power transistor circuit embodying principles of the present invention.

Illustrated in FIG. 8 is a circuit 300 that is a portion of another power amplifier in accordance with another form. A first RF input signal, RF Input 1, is coupled to a terminal 302 that is connected to a node 311 via an inductance 310 which represents an inherent inductive element of a conductor. A first electrode of a capacitor 316 is connected to node 311 and a second electrode of the capacitor 316 is connected to a supply voltage labeled $V_{SS}$. In one form $V_{SS}$ may be implemented as ground. A first terminal of an inductance 312 is connected to node 311 and a second terminal of inductance 312 is connected to a gate of an RF power transistor 314 which is an N-channel transistor. A source of transistor 314 is connected to $V_{SS}$. A drain of transistor 314 is connected to a first terminal of an inductance 330. A first terminal of an inductance 332 is also connected to the drain of transistor 314. A second terminal of inductance 332 is connected to a first RF output labeled RF Output 1. A supply voltage $V_{DD}$ is connected to the RF Output 1. A second terminal of inductance 330 is connected to a node 336. A first electrode of a capacitor 334 is connected to node 336, and a second electrode of capacitor 334 is connected to $V_{SS}$. A first terminal of an inductance 338 is connected to node 336, and a second terminal of inductance 338 is connected to a first terminal of a resistor 340. A second terminal of resistor 340 is connected to a first terminal of an inductance 342. A second terminal of the inductance 342 is connected to a first electrode of a capacitor 344. A second electrode of capacitor 344 is connected to $V_{SS}$.

A second RF input signal, RF Input 2, is coupled to a terminal 304 that is connected to a node 319 via an inductance 318 which represents an inherent inductive element of a conductor. A first electrode of a capacitor 324 is connected to node 319 and a second electrode of the capacitor 324 is connected to a supply voltage labeled $V_{SS}$. A first terminal of an inductance 320 is connected to node 319 and a second terminal of inductance 320 is connected to a gate of an RF power transistor 322 which is an N-channel transistor. A source of transistor 322 is connected to $V_{SS}$. A drain of transistor 322 is connected to a first terminal of an inductance 348. A first terminal of an inductance 346 is also connected to the drain of transistor 322. A second terminal of inductance 346 is connected to a second RF output labeled RF Output 2. The supply voltage $V_{DD}$ is connected to the RF Output 2. A second terminal of inductance 348 is connected to a node 351. A first electrode of a capacitor 350 is connected to node 351, and a second electrode of capacitor 350 is connected to $V_{SS}$. A first terminal of an inductance 352 is connected to node 351, and a second terminal of inductance 352 is connected to the first terminal of resistor 340. All illustrated inductances within circuit 300 are inherent inductive elements of a conductor.

In operation, circuit 300 is a dual RF path circuit that is in push-pull, balanced, or a Doherty configuration. There is no decoupling circuit on the gate side of either RF power transistor 314 or RF power transistor 322. Each of the RF power transistors is biased separately by the gate voltage $V_{G1}$ and $V_{G2}$. On the drain side, the same D.C. voltage, $V_{DD}$, is present on each drain. Therefore, a common decoupling circuit may be used for both RF output signal paths.

Figure 9:
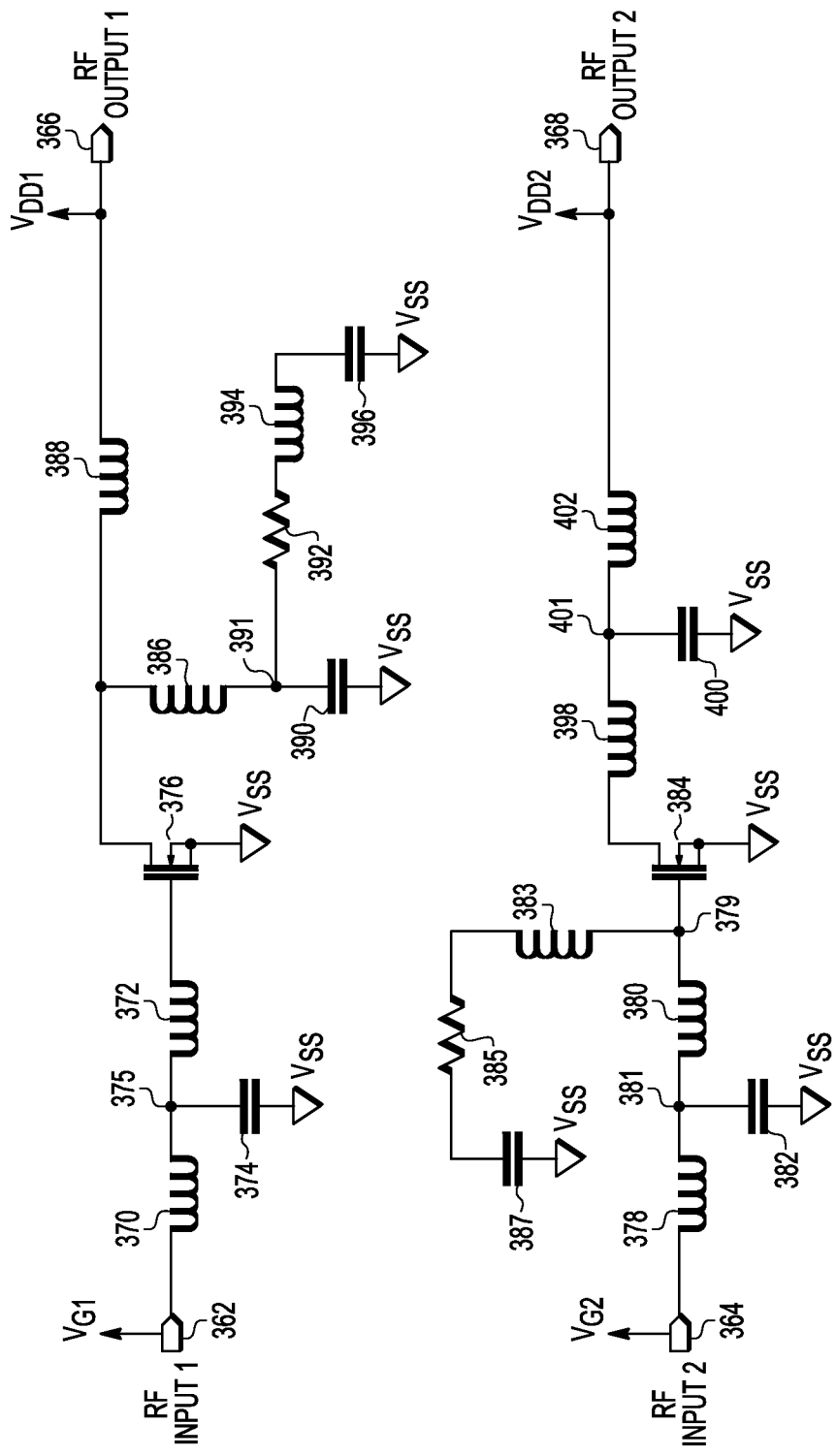
FIG. 9 illustrates in schematic diagram form another power transistor circuit embodying principles of the present invention.

Illustrated in FIG. 9 is a circuit 360 that is a portion of another power amplifier in accordance with another form. A first RF input signal, RF Input 1, is coupled to a terminal 362 that is connected to a node 375 via an inductance 370 which represents an inherent inductive element of a conductor. A first electrode of a capacitor 374 is connected to node 375 and a second electrode of the capacitor 374 is connected to a supply voltage labeled $V_{SS}$. In one form $V_{SS}$ may be implemented as ground. A first terminal of an inductance 372 is connected to node 375 and a second terminal of inductance 372 is connected to a gate of an RF power transistor 376 which is an N-channel transistor. A source of transistor 376 is connected to $V_{SS}$. A drain of transistor 376 is connected to a first terminal of an inductance 386. A first terminal of an inductance 388 is also connected to the drain of transistor 314. A second terminal of inductance 388 is connected to a first RF output labeled RF Output 1 at a terminal 366. A supply voltage $V_{DD}$ is connected to the RF Output 1. A second terminal of inductance 386 is connected to a node 391. A first electrode of a capacitor 390 is connected to node 391, and a second electrode of capacitor 390 is connected to $V_{SS}$. A first terminal of a resistor 392 is connected to node 391, and a second terminal of resistor 392 is connected to a first terminal of an inductance 394. A second terminal of inductance 394 is connected to a first electrode of a capacitance 396. A second electrode of the capacitance 396 is connected to $V_{SS}$.

A second RF input signal, RF Input 2, is coupled to a terminal 364 that is connected to a node 381 via an inductance 378. A first electrode of a capacitor 382 is connected to node 381 and a second electrode of the capacitor 382 is connected to the $V_{SS}$ supply voltage. A first terminal of an inductance 380 is connected to node 381 and a second terminal of inductance 380 is connected at a node 379 to a gate of an RF power transistor 384 which is an N-channel transistor. A gate-side decoupling circuit is formed by inductance 383, resistor 385 and a capacitor 387. A first terminal of inductance 383 is connected to the node 379. A second terminal of inductance 383 is connected to a first terminal of a resistor 385. A second terminal of resistor 385 is connected to a first electrode of a capacitor 387. A second electrode of the capacitor 387 is connected to $V_{SS}$. A source of transistor 384 is connected to $V_{SS}$. A drain of transistor 384 is connected to a first terminal of an inductance 398. A second terminal of inductance 398 is connected to a first terminal of an inductance 402 and to a first electrode of a capacitor 400 at a node 401. A second terminal of inductance 402 is connected to a second RF output labeled RF Output 2 at a terminal 368. The supply voltage $V_{DD}$ is connected to the RF Output 2. A second terminal of capacitor 400 is connected to the $V_{SS}$ supply voltage. All illustrated inductances within circuit 360 are inherent inductive elements of a conductor.

In operation, circuit 360 is again a dual RF path circuit that is in push-pull, balanced, or a Doherty configuration. There is a decoupling circuit on the gate side of only one RF power transistor 376 and a decoupling circuit on the drain side of only the other RF power transistor 384. Each of the RF power transistors is biased separately by the gate voltage $V_{G1}$ and $V_{G2}$. On the drain side, either the same or differing D.C. voltages, $V_{DD1}$ and $V_{DD2}$, are present on each drain. The RF power transistor 376 has a shunt-L output and uses a drain baseband termination. The RF power transistor 384 has a T-match output and uses a gate baseband termination. The gate and drain baseband terminations can be used independently of each other. Different external output networks would be used for the RF output 1 and the RF output 2.

Figure 10:
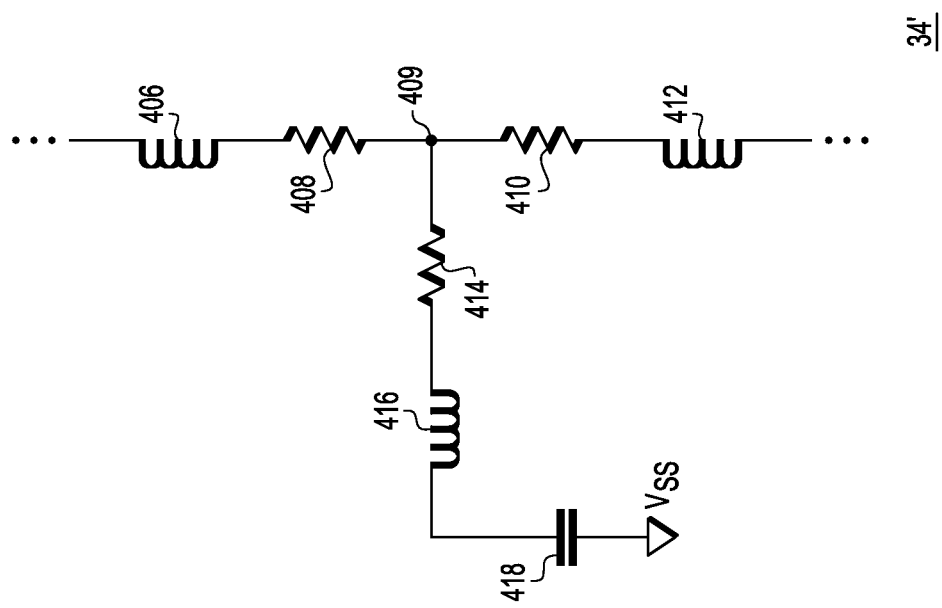
FIG. 10 illustrates in schematic diagram form another decoupling circuit for use in any of the illustrated power transistor circuits.

Illustrated in FIG. 10 is a decoupling network 34' which may be used in lieu of any of the illustrated decoupling networks, including decoupling network 34 of FIG. 3. When used as a replacement for decoupling network 34, the decoupling network 34' has an inductance 406 having a first terminal that would connect with the gate of power FET 26 of FIG. 3. A second terminal of inductance 406 is connected to a first terminal of a resistor 408. A second terminal of resistor 408 is connected to a first terminal of a resistor 414 and to a first terminal of a resistor 410 at a node 409. A second terminal of resistor 414 is connected to a first terminal of an inductance 416. A second terminal of inductance 416 is connected to a first electrode of a capacitor 418. A second electrode of capacitor 418 is connected to a terminal for receiving $V_{SS}$. A second terminal of resistor 410 is connected to a first terminal of an inductance 412. A second terminal of inductance 412 would connect with the gate of power FET 28 of FIG. 3. All illustrated inductances within circuit 34' are inherent inductive elements of a conductor.

In operation, decoupling network 34' utilizes resistor 408 in one signal path branch and utilizes resistor 410 is the other signal path branch in addition to using a common resistor 414 in a common branch to the two signal paths. In this way the resistance is distributed and functions to dampen the low frequency resonance which is introduced by using a decoupling network with pre-distortion. Resistor 414 is optional, as the resistance it provides can be distributed in resistors 408 and 410.

Figure 11:
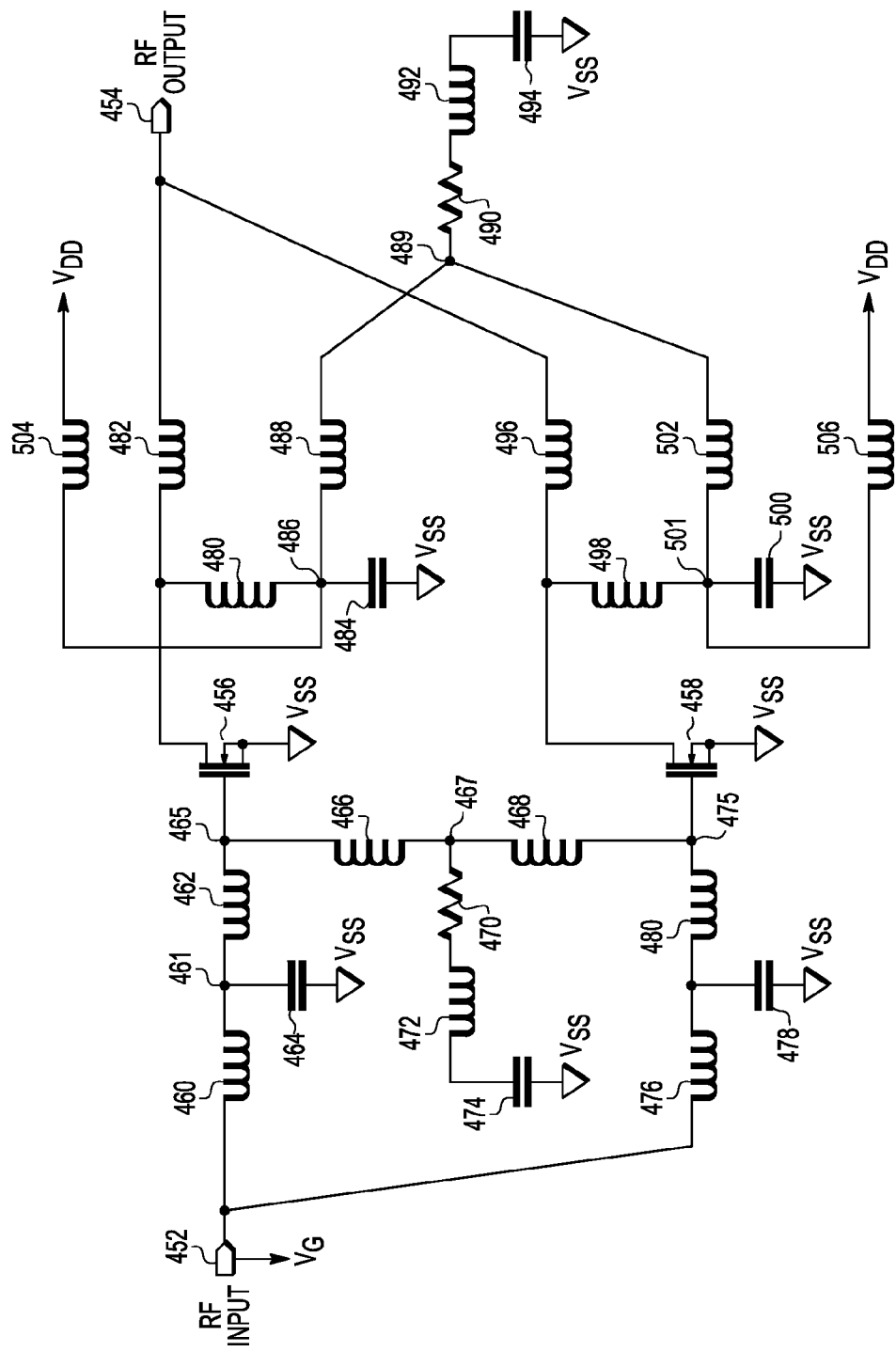
FIG. 11 illustrates in schematic diagram form another power transistor circuit embodying principles of the present invention.

Illustrated in FIG. 11 is a circuit 450 that is a portion of another power amplifier in accordance with another form. An RF input signal is coupled to an RF input terminal 452 and an amplified RF output signal is provided at an RF output terminal 454. A gate bias, $V_G$, is connected to the input terminal 452. The circuit 450 generally has a power FET 456 (Field Effect Transistor) and a power FET 458 with each having a gate, a drain and a source. In the illustrated form, the power FETs 456 and 458 each are N-channel devices. A gate-side RF impedance matching network having a capacitor 464 and inductances 460 and 462 is connected between the RF input terminal 452 and the gate of the power FET 456. Inductance 460 has a first terminal connected to the RF input 452 and a second terminal connected to a first electrode of capacitor 464 and a first terminal of inductance 462 at a node 461. A second electrode of capacitor 464 is connected to $V_{SS}$. A second terminal of inductance 462 is connected to the gate of the power FET 456 at a node 465. A gate-side RF impedance matching network in the form of a capacitor 478 and inductances 476 and 480 is connected between the RF input terminal 452 and the gate of the power FET 458. Inductance 476 has a first terminal connected to the RF input terminal 452 and a second terminal connected to a first electrode of capacitor 478 and a first terminal of an inductance 480 at a node 477. A second electrode of capacitor 478 is connected to $V_{SS}$. A second terminal of inductance 480 is connected to the gate of power FET 458 at a node 475. A gate-side decoupling circuit in the form of inductances 466, 472 and 468, capacitor 474 and resistor 470 is connected between the $V_{SS}$ terminal and each of the gates of power FET 456 and power FET 458. In particular, a first terminal of inductance 466 is connected to the gate of power FET 456 at node 465. A second terminal of inductance 466 is connected to a first terminal of resistor 470 and to a first terminal of inductance 468 at a node 467. A second terminal of inductance 468 is connected to the gate of the power FET 458 at a node 475. A second terminal of resistor 470 is connected to a first terminal of inductance 472. A second terminal of inductance 472 is connected to a first electrode of a capacitor 474. A second electrode of capacitor 474 is connected to the $V_{SS}$ terminal.

A drain-side RF impedance matching network in the form of inductances 480 and 482 and capacitor 484 is provided for the power FET 456. A drain-side impedance matching network in the form of inductances 496, 498 and capacitor 500 is provided. A first terminal of each of inductance 480 and inductance 482 is connected to the drain of the power FET 456. A second terminal of inductance 482 is connected to the RF output at terminal 454. A second terminal of inductance 480 is connected to a first electrode of capacitor 484 at a node 486. A second electrode of capacitor 484 is connected to the $V_{SS}$ terminal. A first terminal of each of inductance 496 and inductance 498 is connected to the drain of the power FET 458. A second terminal of inductance 496 is connected to the RF output at terminal 454. A second terminal of inductance 498 is connected to a first electrode of capacitor 500 at a node 501. A second electrode of capacitor 500 is connected to the $V_{SS}$ terminal. A drain-side decoupling network in the form of inductances 488, 502 and 492, resistor 490 and capacitor 494 is provided. A first terminal of an inductance 488 is connected to node 486, and a second terminal of inductance 488 is connected to a first terminal of a resistor 490 at a node 489. A second terminal of resistor 490 is connected to a first terminal of an inductance 492. A second terminal of inductance 492 is connected to a first electrode of capacitor 494. A second electrode of capacitor 494 is connected to the $V_{SS}$ terminal. The $V_{DD}$ power supply is connected to node 486 via inductance 504 rather than being connected to the RF output at terminal 454. The $V_{DD}$ power supply is also connected to node 501 via inductance 506. A first terminal of an inductance 506 is connected is connected to $V_{DD}$. A second terminal of inductance 506 is connected to node 501. All illustrated inductances within circuit 450 are inherent inductive elements of a conductor.

In operation, circuit 450 uses two separate D.C. voltage pins or terminals wherein $V_{DD}$ is connected via an inductive component conductor to node 486 and node 501. When $V_{DD}$ is applied to these nodes as opposed to the RF output terminals, the parallel inductance formed by inductance 504 being in parallel with inductances 480 and 482 moves the resonance higher in frequency. As a result, no λ/4 signal termination is needed. Thus a user of circuit 450 will have a smaller sized product. It should be understood that the separate D.C. pins may be used on the drain side with either a single RF output terminal or with two RF output terminals.

The use of separate D.C. pins or terminals may also be applied to the gate side of RF power transistors 456 and 458. In particular, rather than applying the $V_G$ gate bias to input terminal 452, the D.C. voltage may be applied to node 465 and to node 475. Either separate values of $V_G$, such as $V_{G1}$ and $V_{G2}$, may be used or a same gate voltage may be applied to both of nodes 465 and 475. Whether separate pins are used only on the gate side, the drain side or on both sides, the effect of all of these variations is to move the resonance caused by a decoupling circuit using pre-distortion to a higher frequency.

Figure 12:
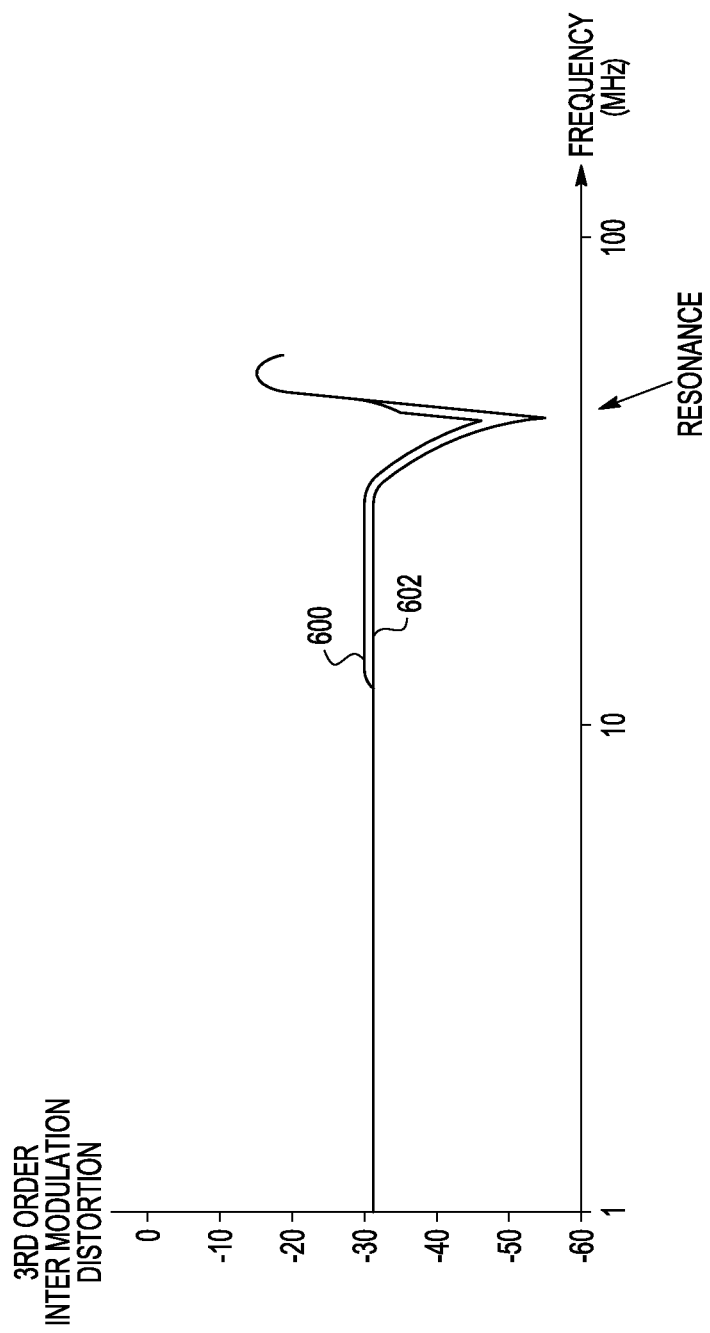
FIG. 12 illustrates in graphical form a two-tone frequency response of a known power amplifier circuit with a decoupling network that provides instantaneous bandwidth capability of no more than 75 MHz.

Illustrated in FIG. 12 is a graphical representation of a two-tone frequency response of a power amplifier that uses a conventional decoupling circuit. The vertical axis is the signal strength of third order intermodulation distortion. The horizontal axis is frequency spacing of the two tones. The values which are provided are for explanation purposes only and are exemplary. The values are dependent upon various factors, including semiconductor processing parameters.

There is an upper third order intermodulation distortion signal 602 and a lower third order intermodulation distortion signal 600. Both intermodulation distortion signals exhibit a pronounced resonance in the lower band between ten and one hundred MHz.

Figure 13:
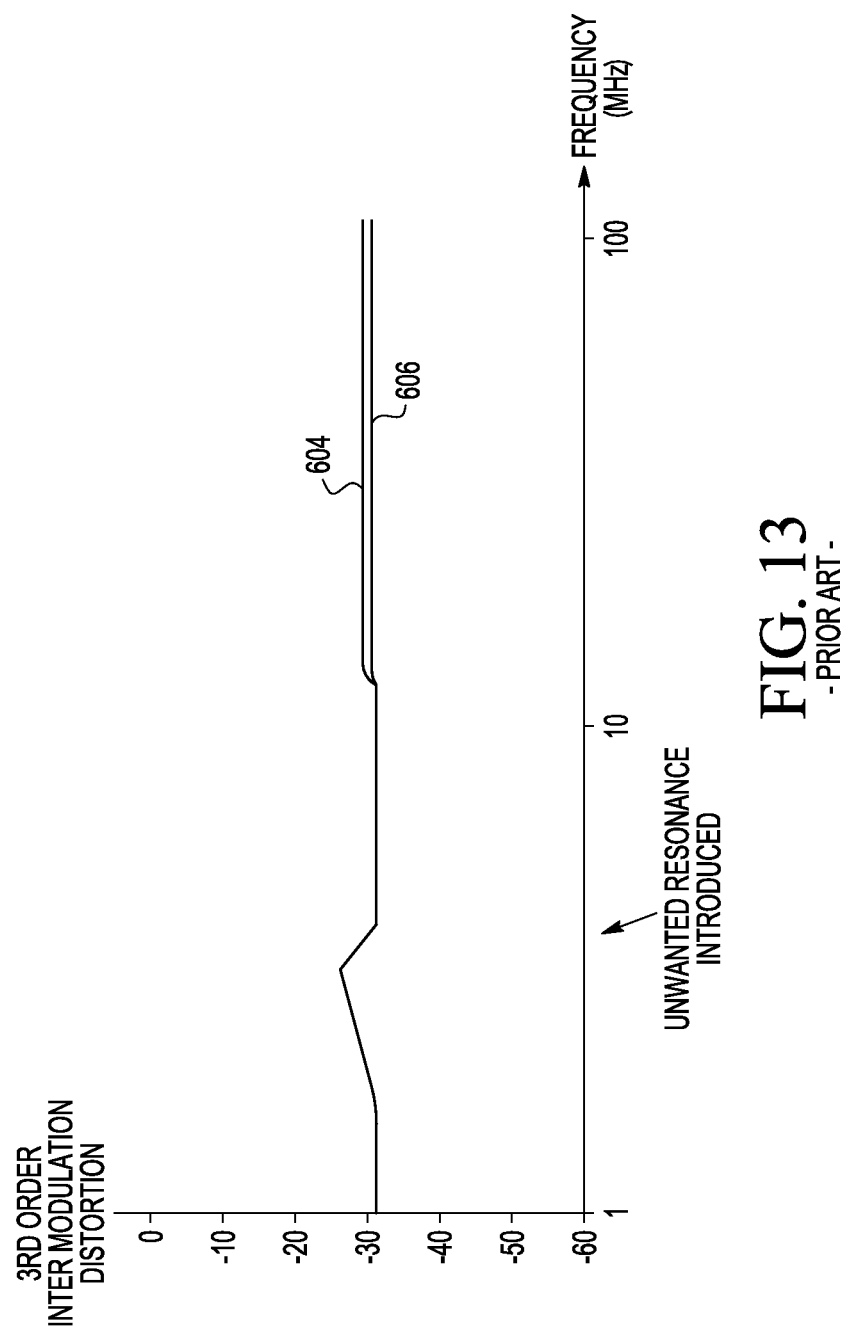
FIG. 13 illustrates in graphical form a two-tone frequency response of a known power amplifier circuit with a wide instantaneous bandwidth decoupling network having an unwanted low frequency resonance.

Illustrated in FIG. 13 is a graphical representation of a conventional power amplifier that uses a prior art decoupling circuit. The vertical axis is again the signal strength of third order intermodulation distortion. The horizontal axis is frequency spacing of the two tones. The values which are provided are for explanation purposes only and are exemplary. The values are dependent upon various factors, including semiconductor processing parameters. There is an upper third order intermodulation distortion signal 606 and a lower third order intermodulation distortion signal 604. While the resonance between ten and one hundred MHz has been shifted up in frequency, additional distortion has been added below ten MHz. In one exemplary form, this resonance is present at around six MHz, but the location of the resonance is dependent upon process specifications and parameters.

Figure 14:
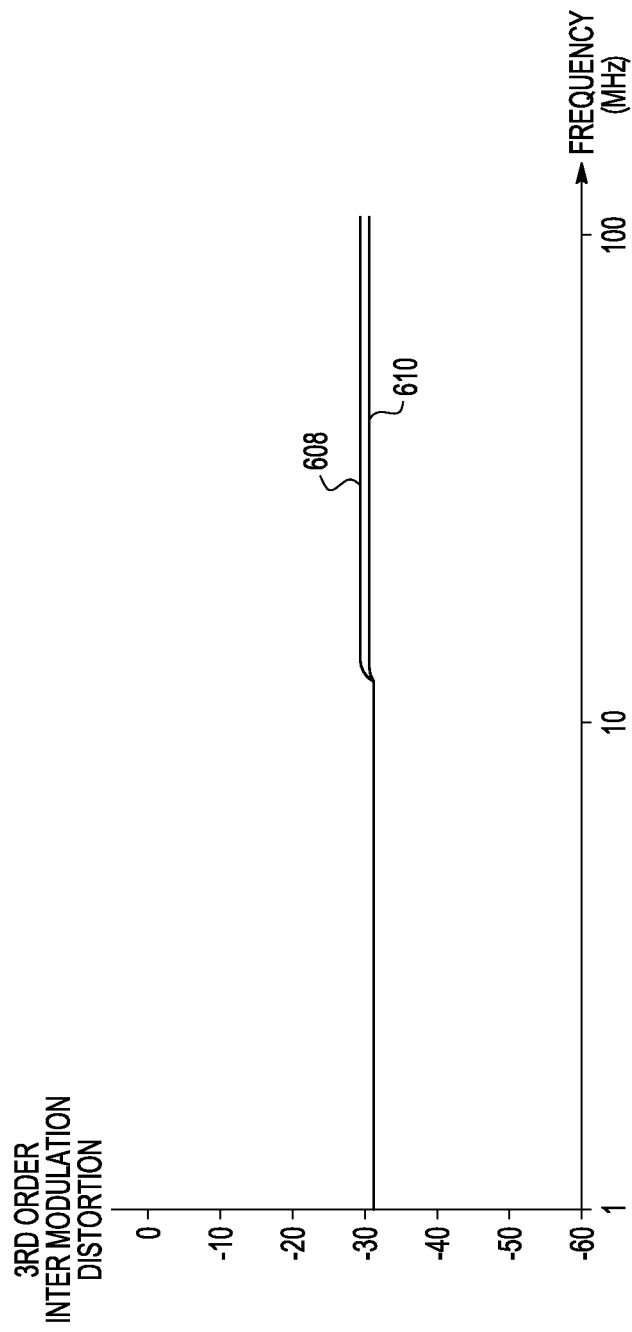
FIG. 14 illustrates in graphical form a two-tone frequency response of any of the power transistor circuits embodying principles of the present invention.

Illustrated in FIG. 14 is a graphical representation of a power amplifier that uses a decoupling circuit embodying principles of the present invention. The vertical axis is again the signal strength of third order intermodulation distortion. The horizontal axis is frequency spacing of the two tones. The values which are provided are for explanation purposes only and are exemplary. The values are dependent upon various factors, including semiconductor processing parameters. There is an upper third order intermodulation distortion signal 610 and a lower third order intermodulation distortion signal 608. With the dampening provided by one or more resistors in a decoupling circuit, a substantially linear frequency response in the low band is obtained. The previously introduced resonance between ten and one hundred MHz has been shifted higher in frequency, in addition to the unwanted distortion below ten MHz being removed.

It should be understood that other alternatives of the gate and/or drain side decoupling network for a power FET include can incorporate the resistor which performs the dampening function into the power FET itself with resistance added to the gate structure of the power FET. Various semiconductor gate structures may be created to implement a resistive component for a gate of a power FET. Also, while various embodiments described herein have detailed a dual RF signal path configuration, it should be understood that any integer number of RF paths may be implemented.

By now it should be appreciated that there has been provided a radio frequency (RF) power transistor circuit having a first power transistor having a control electrode coupled to an input terminal for receiving an RF input signal. The first power transistor has a first current electrode for providing an RF output signal at an output terminal, and a second current electrode coupled to a power supply voltage terminal. A first decoupling circuit has a first inductive element, a first resistor, and a first capacitor coupled together in series between the control electrode of the first power transistor and the power supply voltage terminal. The first decoupling circuit is for dampening a resonance at a frequency lower than an RF frequency. In one form the RF power transistor circuit further has a second power transistor having a control electrode coupled to both the RF input terminal and to the first decoupling circuit, a first current electrode coupled to the RF output terminal, and a second current electrode coupled to the power supply voltage terminal. In another form the RF power transistor circuit further has a second decoupling circuit. The second decoupling circuit has a second inductive element, a second resistor, and a second capacitor coupled together in series between the first current electrode of the first power transistor and the power supply voltage terminal. In another form a resistance value of the first resistor is in a range of 0.5 ohms to 5 ohms. In another form a capacitance value of the first capacitor is in a range of 10 nano Farads to 1,000 nano Farads. In yet another form an inductance value of the first inductive element is in a range of 0.1 nano Henry to 3 nano Henrys. In yet another form the first inductive element has a first terminal coupled to the control electrode of the first power transistor, and a second terminal. The first resistor has a first terminal coupled to the second terminal of the first inductive element, and a second terminal. The first capacitor has a first electrode coupled to the second terminal of the resistor, and a second electrode coupled to the power supply voltage terminal. The RF power transistor circuit further has a second capacitor having a first electrode coupled to the first terminal of the first inductive element, and a second electrode coupled to the first electrode of the first capacitor. In another form the RF power transistor circuit further has a second decoupling circuit having a second inductive element having a first terminal coupled to the first current electrode of the first power transistor, and a second terminal. A second resistor has a first terminal coupled to the second terminal of the second inductive element, and a second terminal. A third capacitor has a first electrode coupled to the second terminal of the second resistor, and a second electrode. A fourth capacitor has a first electrode coupled to the first terminal of the second inductive element, and a second electrode coupled to the first electrode of the third capacitor. In another form the RF power transistor circuit further has an RF impedance matching network having a second inductive element having a first terminal coupled to the control electrode of the first power transistor, and a second terminal. A second capacitor has a first electrode coupled to the second terminal of the second inductive element, and a second electrode coupled to the power supply voltage terminal. The RF impedance matching network is for preventing a current at the first electrode of the second capacitor when the RF power transistor circuit is operating at an RF frequency.

In another form a radio frequency (RF) power transistor circuit is provided having a first power transistor having a control electrode coupled to an input terminal for receiving a radio frequency input signal. A first current electrode provides an RF output signal at an output terminal, and a second current electrode is coupled to a power supply voltage terminal. A first decoupling circuit has a first inductive element, a first resistor, and a first capacitor coupled together in series between the first current electrode of the first power transistor and the power supply voltage terminal. The first decoupling circuit is for dampening a resonance at a frequency lower than an RF frequency. In one form a resistance value of the first resistor is in a range of 0.5 ohms to 5 ohms. In another form a capacitance value of the first capacitor is in a range of 10 nano Farads to 1,000 nano Farads. In yet another form an inductance value of the first inductive element is in a range of 0.1 nano Henry to 3 nano Henrys. In yet another form the RF power transistor circuit further has a second power transistor having a control electrode coupled to the RF input terminal, a first current electrode coupled to both the RF output terminal and to the first decoupling circuit, and a second current electrode coupled to the power supply voltage terminal. In another form the RF power transistor circuit further has a second decoupling circuit, the second decoupling circuit having a second inductive element, a second resistor, and a second capacitor coupled together in series between the control electrode of the first power transistor and the power supply voltage terminal. In yet another form the RF power transistor circuit of claim 15, further comprising a second power transistor having a control electrode coupled to both the RF input terminal and to the first decoupling circuit, a first current electrode coupled to both the RF output terminal and to the second decoupling circuit, and a second current electrode coupled to the power supply voltage terminal.

In another form there is herein provided a radio frequency (RF) power transistor circuit having a first power transistor having a control electrode coupled to an input terminal for receiving an RF input signal. A first current electrode of the first power transistor provides an RF output signal at an output terminal, and a second current electrode of the first power transistor is coupled to a power supply voltage terminal. A second power transistor has a control electrode coupled to the control electrode of the first power transistor, a first current electrode coupled to the first current electrode of the first power transistor, and a second current electrode coupled to the power supply voltage terminal. A first decoupling circuit has a first inductive element, a first resistor, and a first capacitor coupled together in series between the coupled together control electrodes of the first and second power transistors and the power supply voltage terminal. A second decoupling circuit has a second inductive element, a second resistor, and a second capacitor coupled together in series between the coupled together first current electrodes of the first and second power transistors and the power supply voltage terminal. In another form a resistance value of each of the first and second resistors is in a range of 0.5 ohms to 5 ohms. In one form a capacitance value of each of the first and second capacitors is in a range of 10 nano Farads to 1,000 nano Farads and an inductance value of each of the first and second inductive elements is in a range of 0.1 nano Henry to 3 nano Henrys. In yet another form the first and second decoupling circuits are for dampening a resonance at a frequency lower than an RF frequency. In yet another form the RF power transistor circuit has a third capacitor having a first electrode coupled to the control electrode of the first power transistor, and a second electrode coupled to the power supply voltage terminal. A fourth capacitor has a first electrode coupled to the control electrode of the second power transistor, and a second electrode coupled to the power supply voltage terminal, wherein the third and fourth capacitors provide an open circuit at an RF frequency.

Although the invention has been described with respect to specific conductivity types or polarity of potentials, skilled artisans appreciate that conductivity types and polarities of potentials may be reversed. As an alternative, the VSS terminal may be implemented as a potential other than ground wherein the $V_{SS}$ potential is lower in polarity than the $V_{DD}$ potential.

The term "coupled," as used herein, is not intended to be limited to a direct coupling or a mechanical coupling. Although the invention is described herein with reference to specific embodiments, various modifications and changes can be made without departing from the scope of the present invention as set forth in the claims below. For example, various types of transistors which are used to implement the illustrated circuit functions may be implemented, such as MOS (metal oxide semiconductor), bipolar, GaAs, GaN, silicon on insulator (SOI) and others. The amount of power supply voltage reduction can be adjusted according to specific application requirements. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A radio frequency (RF) power transistor circuit comprising:
    a first power transistor having a first control electrode for receiving a first RF input signal, and a first current electrode for providing a first RF output signal;
    a second power transistor having a second control electrode for receiving a second RF input signal, and a second current electrode for providing a second RF output signal;
    a first node electrically coupled to the first and second current electrodes; and
    a decoupling circuit comprising a first inductive element, a resistor, and a first capacitor coupled together in series between the first node and a voltage reference.

2. The RF power transistor circuit of claim 1, wherein the first inductive element and the first capacitor form an inductor/capacitor circuit that has a resonance at a frequency below a passband range of frequencies for the RF power transistor circuit.

3. The RF power transistor circuit of claim 2, wherein the resistor is configured to dampen the resonance of the inductor/capacitor circuit.

4. The RF power transistor circuit of claim 2, wherein the resonance is 20 megahertz or less.

5. The RF power transistor circuit of claim 1, further comprising:
    a first D.C. blocking capacitor coupled between the first node and the voltage reference.

6. The RF power transistor circuit of claim 5, further comprising:
    a second inductive element coupled between the first current electrode of the first power transistor and the first D.C. blocking capacitor.

7. The RF power transistor circuit of claim 6, further comprising:
    a second node between the second inductive element and the first D.C. blocking capacitor; and
    a third inductive element coupled between the first node and the second node.

8. The RF power transistor circuit of claim 7, further comprising:
    a second D.C. blocking capacitor coupled between the first node and the voltage reference.

9. The RF power transistor circuit of claim 8, further comprising:
a fourth inductive element coupled between the second current electrode of the second power transistor and the second D.C. blocking capacitor.

10. The RF power transistor circuit of claim 9, further comprising:
a third node between the fourth inductive element and the second D.C. blocking capacitor; and
a fifth inductive element coupled between the first node and the third node.

11. The RF power transistor circuit of claim 1, further comprising:
an RF output terminal;
a second inductive element coupled between the first current electrode of the first power transistor and the RF output terminal; and
a third inductive element coupled between the second current electrode of the second power transistor and the RF output terminal.

12. The RF power transistor circuit of claim 1, further comprising:
a first RF output terminal;
a second RF output terminal;
a second inductive element coupled between the first current electrode of the first power transistor and the first RF output terminal; and
a third inductive element coupled between the second current electrode of the second power transistor and the second RF output terminal.

13. The RF power transistor circuit of claim 1, wherein the decoupling circuit presents a high impedance path to RF signals within a passband range of frequencies between 1.6 gigahertz to 3.7 gigahertz.

14. The RF power transistor circuit of claim 1, wherein the decoupling circuit provides a low frequency termination to ground for distortion products that develop due to envelope frequencies.

15. The RF power transistor circuit of claim 1, wherein a resistance value of the resistor is in a range of 0.5 ohms to 5 ohms.

16. The RF power transistor circuit of claim 1, wherein a capacitance value of the first capacitor is in a range of 10 nano Farads to 1,000 nano Farads.

17. The RF power transistor circuit of claim 1, wherein an inductance value of the first inductive element is in a range of 0.1 nano Henrys to 3 nano Henrys.

* * * * *